(12) United States Patent
Rangarajan et al.

(10) Patent No.: US 6,420,104 B1
(45) Date of Patent: Jul. 16, 2002

(54) METHOD OF REDUCING CONTACT SIZE BY SPACER FILLING

(75) Inventors: Bharath Rangarajan, Santa Clara, CA (US); Stephen Keetai Park, Austin, TX (US); Guarionex Morales, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/705,941

(22) Filed: Nov. 3, 2000

(Under 37 CFR 1.47)

Related U.S. Application Data

(60) Provisional application No. 60/162,688, filed on Nov. 1, 1999.

(51) Int. Cl.[7] .......................................... H01L 21/4763
(52) U.S. Cl. ...................................... 430/640; 438/595
(58) Field of Search .................................. 438/595, 640

(56) References Cited

U.S. PATENT DOCUMENTS

| 4,489,481 A | * | 12/1984 | Jones ........................... 29/591 |
| 5,516,710 A | * | 5/1996 | Boyd et al. .................... 437/31 |
| 5,874,359 A | * | 2/1999 | Liaw et al. .................. 438/640 |
| 5,981,376 A | * | 11/1999 | Komatsu et al. ............ 438/629 |

* cited by examiner

*Primary Examiner*—David L. Talbott
*Assistant Examiner*—David A. Zarneke
(74) *Attorney, Agent, or Firm*—Foley & Lardner

(57) ABSTRACT

A method of reducing contact size in an integrated circuit includes providing an insulating layer over a semiconductor substrate including a plurality of gate structures, creating an aperture extending through the insulating layer and having side walls, providing a spacer on the side walls of the aperture, and providing a contact in the aperture. The lateral sides of the contact abut the spacer. A contact structure is also disclosed in which a spacer separates a contact from a gate structure to avoid charge gain or loss between the contact and gate structure.

19 Claims, 2 Drawing Sheets

METHOD OF REDUCING CONTACT SIZE BY SPACER FILLING

CROSS REFERENCE TO RELATED APPLICATIONS

This application claims the benefit of U.S. provisional Application Ser. No. 60/162,688 by Rangarajan et al., entitled "Method Of Reducing Contact Size By Spacer Filling" filed Nov. 11, 1999.

This patent application is related to U.S. application Ser. No. 09/430,877 by Park, et al., entitled "Flash Memory With Less Susceptibility To Floating Gate Charge Gain And Loss"; U.S. application Ser. No. 09/430,845 by Shields, et al., entitled "Dual Width Contact For Charge Gain Reduction"; U.S. application Ser. No. 09/430,848 by Shields, et al., entitled "Spacer Narrowed, Dual Width Contact For Charge Gain Reduction"; and U.S. application Ser. No. 60/162,818 by Park, et al., entitled "Flash Memory With Less Susceptibility to Charge Gain and Charge Loss", all of which were filed on an even date with the provisional application from which this application claims benefit and assigned to the assignee of the present invention.

FIELD OF THE INVENTION

The present invention relates to integrated circuits and to methods of manufacturing integrated circuits. More particularly, the present invention relates to a method of reducing integrated circuit contact size using spacer filling, thereby reducing charge-gain effects.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). ICs often include flash memory cells.

Flash memory cells are generally comprised of a transistor connected to a word line and a bit line. The transistor includes a gate stack comprised of a polysilicon cap, a control gate, a control gate dielectric, a floating gate and a tunnel oxide. The polysilicon cap is disposed over the control gate, which is disposed over the control gate dielectric. The control gate dielectric is disposed over the floating gate, which is disposed over the tunnel oxide. The gate stack is located between a source and a drain. An insulative spacer abuts each side of the gate stack. The drain is connected to the bit line through a contact. The word line is connected to the control gate of the transistor. The flash memory cell stores data (e.g., a 1 or 0) in the floating gate.

Generally, the transistor is covered by a high temperature oxide and an interlevel dielectric to insulate it from subsequently formed metal layers. An aperture or hole is etched through the interlayer dielectric and the high temperature oxide. The hole is filled with a conductive material to provide connections to the transistor, to conductors, or other circuit structures. For example, a contact can extend from the bit line through the interlevel dielectric to the drain of the transistor. In another example, a contact or conductive via can extend through the interlevel dielectric to connect to the gate stack.

As transistors disposed on integrated circuits (ICs) become smaller (e.g., transistors with gate lengths approaching 50 nm), CMOS fabrication processes must scale the dimensions of the transistors. That is, there must be proportional operational characteristics of structural elements in the ultra-small dimensions of a sophisticated transistor.

One problem associated with CMOS scaling involves spacing between gate stacks and contacts. As mentioned above, contacts are required in an IC device to provide electrical connections between layers or levels of the integrated circuit device. Semiconductor devices typically include a multitude of transistors which are coupled together in particular configurations through contacts.

Contacts are generally coupled to the source region and/or drain region of the transistors disposed on the integrated circuit. The contact is often connected to the source and drain region via a silicide layer formed in a high temperature process. The silicide layer reduces drain/source series resistance.

In conventional processes, contacts must be spaced from the gate conductor by a minimum acceptable distance (often at least one minimum lithographic feature). Charge loss and charge gain can occur when electrons travel laterally through the high temperature oxide or interlayer dielectric between the contact and the floating gate. Such charge gain and loss in the floating gate can destroy or corrupt the data stored in the memory cell.

Indeed, as integrated circuits have become more dense, distances between transistors and transistor components has become smaller. As the distance between contacts and floating gates decreases, a transistor's susceptibility to charge gain and loss is also increased. Therefore, charge gain and loss problems associated with contacts can be particularly troublesome as integrated circuits contain more transistors.

One possible solution is to increase the space on the IC layout. Nevertheless, increased contact to gate structure spacing results in lower device density. Another possible solution is to reduce the contact size by printing smaller contacts. However, printing very small contacts is a challenge to lithography. Further, small contacts cause problems associated with high contact resistance.

Thus, there is a need to reduce the charge-gain problem associated with spacing between the contact and the gate structure. Further, there is a need to provide an integrated circuit with minimal contact to gate structure spacing while using contacts which do not have high contact resistance. Even further, there is a need to reduce contact size while avoiding manufacturing difficulties associated with small contacts.

SUMMARY OF THE INVENTION

One embodiment of the invention relates to a method of reducing contact size in an integrated circuit. The method includes providing an insulating layer over a semiconductor substrate including a plurality of gate structures, creating an aperture extending through the insulating layer and having side walls, providing a spacer on the side walls of the aperture, and providing a contact in the aperture. The lateral sides of the contact abut the spacer.

Another embodiment of the invention relates to a method of forming an electrical contact in an integrated circuit which includes a gate structure. The electrical contact is located at a distance from the gate structure which avoids charge gain between the contact and the gate structure. The method includes providing a contact hole having side walls and extending through an insulating layer covering the gate structure, providing a spacer material along the side walls of the contact hole, and filling the contact hole with an electrical contact material.

Another embodiment of the invention relates to an integrated circuit including a gate structure and an active region.

The integrated circuit includes an insulating layer disposed over the gate structure and the active region, a contact traversing the insulating layer from the top of the layer to the active region, and an insulating spacer abutting the lateral sides of the contact.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
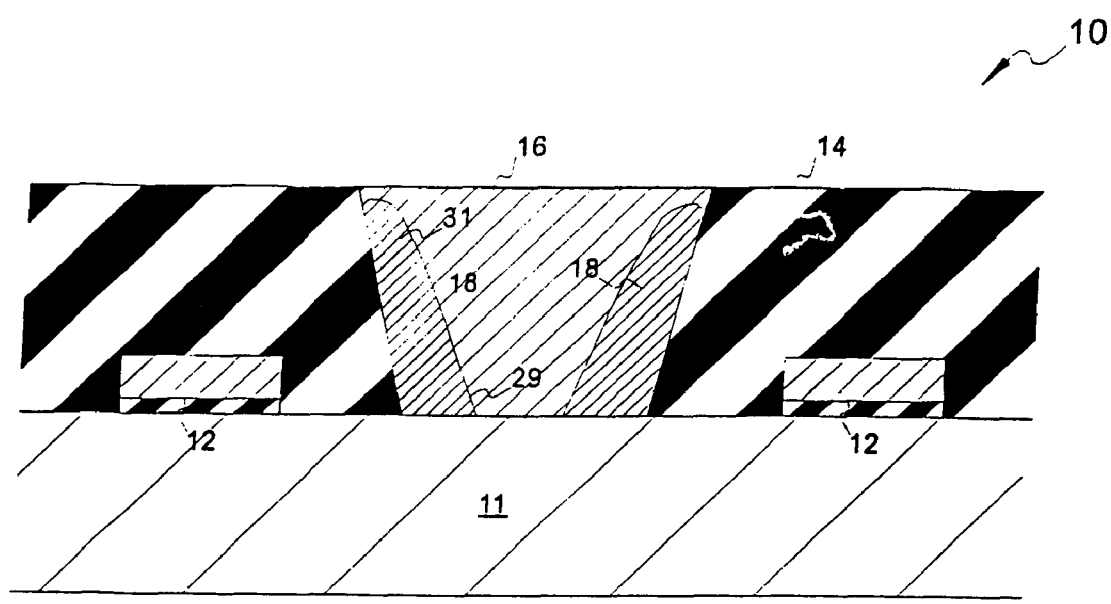
FIG. 1 is a cross-sectional view of a portion of an integrated circuit in accordance with an exemplary embodiment of the present invention.

Referring to FIG. 1, a cross-sectional view of a portion 10 of an integrated circuit is illustrated in accordance with an exemplary embodiment of the present invention. Portion 10 includes a polysilicon or gate structure 12, an insulating layer 14, a contact 16, and spacer 18. Portion 10 is provided on a substrate 11. Substrate 11 can be silicon.

Gate structure 12 includes a conductor, such as, polysilicon and is formed over a gate dielectric. The gate dielectric is disposed over substrate 11. Alternatively, gate structure 12 can be a gate stack for a flash memory cell, which includes a control gate, a tunnel oxide, a control gate dielectric, and a floating gate.

Insulating layer 14 is a layer of an insulating material that separates contact 16 from gate structure 12. Contact 16 is a conductive material which provides an electrical connection to circuit structures. In the exemplary embodiment, contact 16 extends through insulating layer 14 to the drain of the transistor. Spacer 18 is any dielectric material, such as, silicon dioxide, silicon nitride, silicon oxynitride, and silicon rich nitride, and are located abutting lateral sides of contact 16. Spacer 18 advantageously increase the distance between gate structure 12 and contact 16 by the width of one spacer. Contact 16 is connected to a drain or source for the transistor associated with structure 12. Alternatively, contact 16 can be for other connections to structures of portion 10.

Preferably, insulating layer 14 can be densified TEOS, BP-TEOS, $SiO_2$, or nitride and have a thickness of 4,000–12,000 Å. Layer 14 can be a single layer or a composite layer. In addition, layer 14 can be provided over a high temperature oxide layer. Contact 16 has a preferable width of 0.28 μm (e.g., 0.24–0.3 μm). Spacer 18 has a preferable width of 300–500 Å. Gate structure 12 has a preferable thickness of 0.25–0.35 μm. Also, the preferable distance between gate structure 12 and contact 16 is more than 0.13 to 0.15 μm.

The method of forming portion 10 is described below with reference to FIGS. 1-4. The method advantageously forms portion 10 including a contact with adequate spacing from gate structure 12 to avoid charge gain and loss effects.

Figure 2:
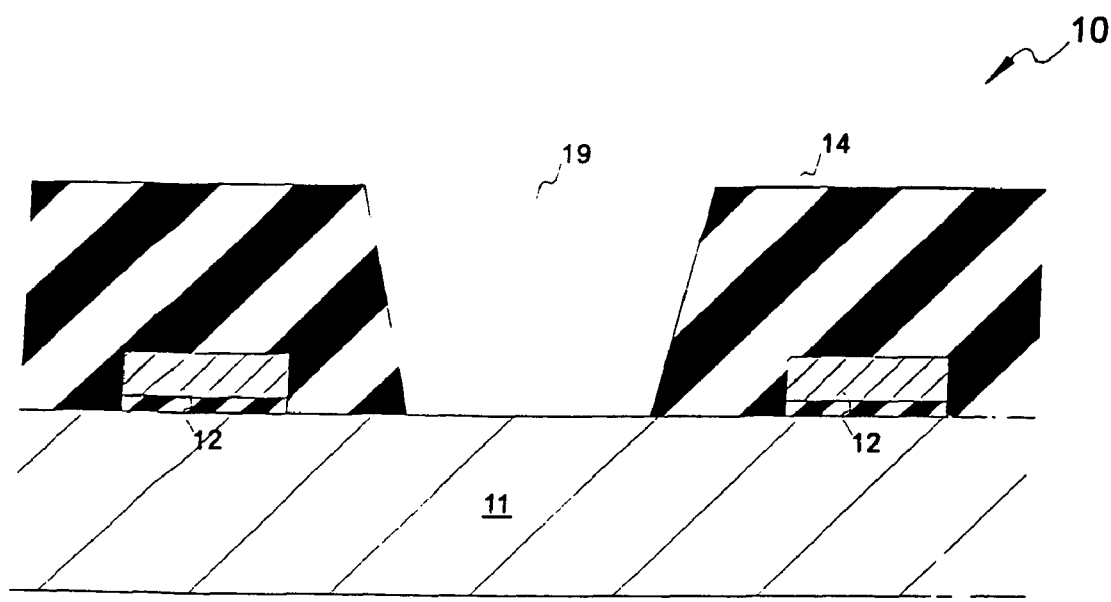
FIG. 2 is a cross-sectional view of the portion of the integrated circuit of FIG. 1, illustrating a contact hole etching step in a method of forming a reduced contact size in accordance with the present invention.

In FIG. 2, a cross-sectional view of portion 10 illustrates a contact hole etching step of insulating layer 14. Dry etching or wet etching may be used to form an aperture 19 in insulating layer 14. Alternatively, other removal processes may be used.

Figure 3:
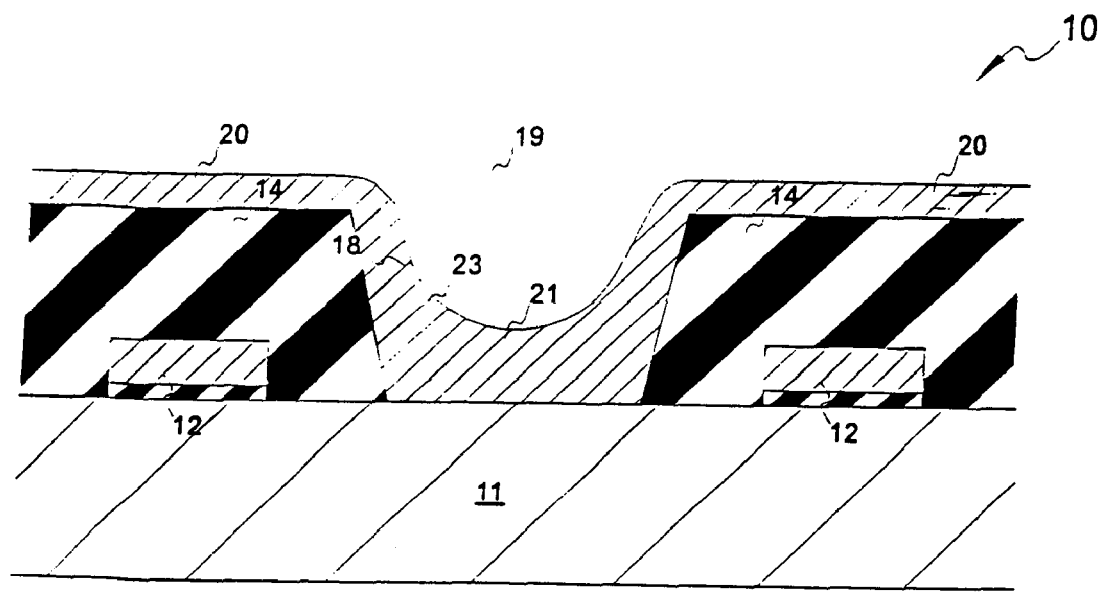
FIG. 3 is a cross-sectional view of the portion of the integrated circuit of FIG. 1, illustrating a spacer deposition step in the method of forming a reduced contact size.

In FIG. 3, a cross-sectional view of portion 10 illustrates a spacer deposition step in which a spacer material layer 20 is deposited over insulating layer 14 and aperture 19. Material 20 is deposited by CVD, LPCDV, or similar processes as a conformal layer. Spacer material layer 20 is any dielectric material, such as, silicon oxynitride (SiON) silicon nitride, silicon oxynitride, and silicon rich nitride. Although aperture 19 is shown as having slanted vertical sides, the vertical sides can be non-slanted. Insulating layer 14 is preferably etched to have slanted walls.

Figure 4:
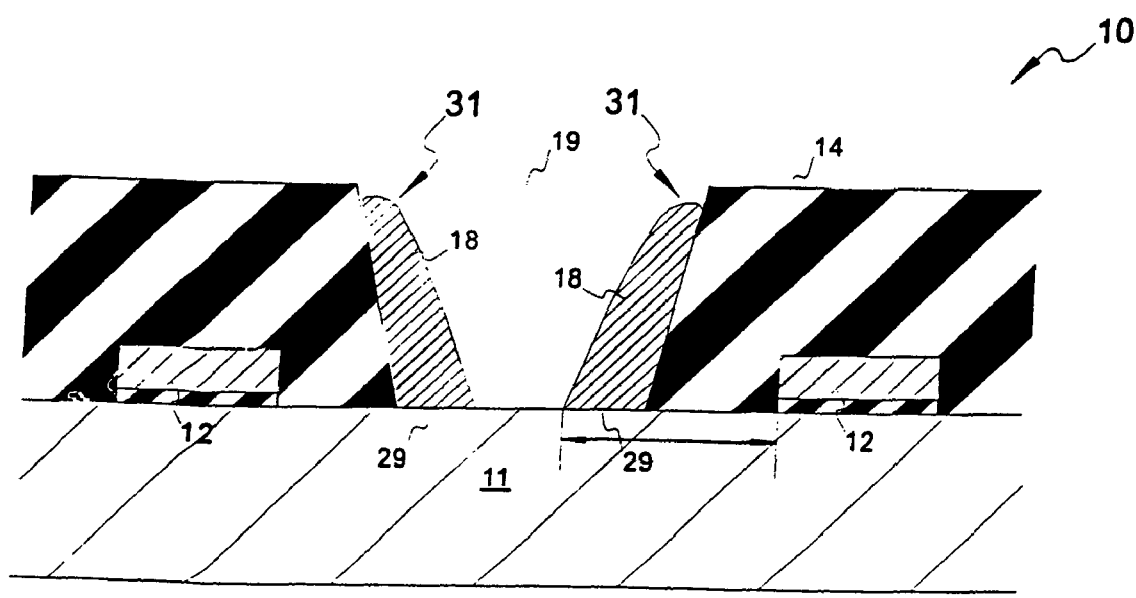
FIG. 4 is a cross-sectional view of the portion of the integrated circuit of FIG. 1, illustrating an etching step in the method of forming a reduced contact size.

In FIG. 4, a cross-sectional view of portion 10 illustrates the result of an isotropic etching step in which spacer material layer 20 is removed from the top of insulating layer 14, leaving spacer 18 along the walls of aperture 19 in insulating layer 14. Layer 20 is also removed from a bottom 21 of aperture 19. Spacer 18 is thicker at a bottom 29 than a top 31. Spacer material layer 20 is removed from the top of insulating layer 14 using dry or wet etching. Alternatively, other removal processes are used.

Referring now to FIG. 1, the cross-sectional view illustrates portion 10 including contact 16 added between spacer 18. Advantageously, contact 16 can be easily printed and etched. Further, the increased gate structure 12 to contact 16 separation provides for charge loss and gain issues. In particular, charge loss or gain between contact 16 and gate structure 12 is avoided.

Thus, the method described with reference to FIGS. 1–4 reduces the charge-gain problem associated with spacing between contact 16 and the gate structure 12. Further, the method provides an integrated circuit with minimal contact to gate structure spacing (FIG. 4) while using contacts which do not have high contact resistance. Even further, the method reduces contact size while avoiding manufacturing difficulties associated with small contacts.

In one embodiment of the present invention, gate structure 12 includes a floating gate (e.g., polysilicon one layer), a tunnel dielectric, a control gate dielectric, a control gate (a polysilicon two layer), and a tungsten or tungsten silicide layer. The process described with reference with FIGS. 1–4 results in a more controllable polysilicon layer to contact distance, which results in smaller charge gains and losses for a flash memory cell.

While the embodiments illustrated in the FIGURES and described above are presently preferred, it should be understood that these embodiments are offered by way of example only. Other embodiments may include, for example, different techniques for providing spacers adjacent the lateral sides of contact 16. The invention is not limited to a particular embodiment, but extends to various modifications, combinations, and permutations that nevertheless fall within the scope and spirit of the appended claims.

What is claimed is:

1. A method of reducing contact size in an integrated circuit, the method comprising:

providing an insulating layer over a semiconductor substrate including a plurality of gate structures;

creating an aperture having tapered side walls extending through the insulating layer and having side walls;

providing a spacer on the side walls of the aperture; and providing a contact in the aperture, the lateral sides of the contact abutting the spacer, wherein the contact has a width of less than approximately 0.3 μm and the distance between the plurality of gate structures and the contact is greater than approximately 0.13 μm.

2. The method of claim 1, wherein the step of providing the spacer further includes depositing a layer of spacer material over the insulating layer and the aperture and removing the layer of spacer material from the top of the insulating layer and the bottom of the aperture to form the spacer on the side walls of the aperture.

3. The method of claim 2, wherein the layer of spacer material comprises a layer of a dielectric material.

4. The method of claim 2, wherein the step of removing the layer of spacer material from the top of the insulating layer comprises an etching process.

5. The method of claim 1, wherein the step of creating an aperture comprises an etching process.

6. The method of claim 1, wherein the spacer has a thickness of approximately 0.25–0.35 μm.

7. The method of claim 1, wherein the step of creating an aperture comprises creating a tapered aperture such as the width of the aperture decreases from the top to the bottom of the insulating layer.

8. The method of claim 1, wherein the spacer is tapered such that the width of the spacer at the bottom of the contact hole is greater than the width of the spacer at the top of the contact hole.

9. The method of claim 8, wherein insulative spacer has a width that increases with increasing depth in the aperture.

10. The method of claim 8, wherein the aperture has a first width at the top of the aperture and a second width at the bottom of the aperture, the first width being greater than the second width.

11. A method of forming an electrical contact in an integratd circuit which includes a gate structure, the electrical contact located at a distance from the gate structure which avoids charge loss and gain between the contact and the gate structure, the method comprising:

providing a contact hole having tapered side walls and extending through an insulating layer covering the gate structure;

providing a spacer material along the side walls of the contact hole; and filling the contact hole with an electrical contact material, wherein the contact hole has a reduced width and the distance between the contact hole and the gate structure minimizes charge gain and loss, wherein the contact hole has a width of less than approximately 0.3 μm and the contact hole is separated from the gate structure by a distance greater than approximately 0.13 μm.

12. The method of claim 11, wherein the step of providing a spacer material further comprises depositing and etching the spacer material.

13. The method of claim 11, wherein the spacer material comprises nitride.

14. The method of claim 11, wherein the width of the contact hole decreases from the top to the bottom of the contact hole.

15. The method of claim 11, wherein the electrical contact comprises tungsten.

16. The method of claim 11, wherein the insulating layer comprises an interlevel dielectric (ILD) stack.

17. The method of claim 11, wherein the spacer material forms a spacer having a tapered width.

18. The method of claim 17, wherein the contact material forms a contact having a taper greater than that of the tapered side walls.

19. A method for forming an integrated circuit having reduced contact size while maintaining a separation between a gate structure and a contact, the method comprising:

forming an insulating layer above a gate structure and a semiconductor substrate;

forming an aperture in the insulating layer, the aperture including tapered side walls;

forming an insulative spacer adjacent to the tapered side walls, the insulative spacer having a tapered width, wherein the insulative spacer has a width of between approximately 300 and 500 angstroms and the distance between the gate structure and the contact is greater than approximately 0.15 μm; and introducing a conductive material into the aperture to form a contact.

* * * * *

UNITED STATES PATENT AND TRADEMARK OFFICE
CERTIFICATE OF CORRECTION

PATENT NO.    : 6,420,104 B1
DATED         : July 16, 2002
INVENTOR(S)   : Bharath Rangarajan, Stephen Keetai Park and Guarionex Morales It is certified that error appears in the above-identified patent and that said Letters Patent is hereby corrected as shown below:

<u>Column 5,</u>
Line 34, delete "integratd" and insert therefor -- integrated --.

Signed and Sealed this

Twenty-first Day of January, 2003

JAMES E. ROGAN
*Director of the United States Patent and Trademark Office*